United States Patent
Piehler et al.

(10) Patent No.: US 9,920,902 B2
(45) Date of Patent: Mar. 20, 2018

(54) LASER SOURCE FOR EXITING A PHOSPHOR AND LIGHT SOURCE COMPRISING A PHOSPHOR

(71) Applicant: Jabil Optics Germany GmbH, Jena (DE)

(72) Inventors: Eberhard Piehler, Jena (DE); Norman Kuehn, Jena (DE); Theresa Kunz, Jena (DE); Gertrud Blei, Jena (DE)

(73) Assignee: Jabil Optics Germany GmbH, Jena (DE)

( * ) Notice: Subject to any disclaimer, the term of this patent is extended or adjusted under 35 U.S.C. 154(b) by 0 days.

(21) Appl. No.: 15/179,462

(22) Filed: Jun. 10, 2016

(65) Prior Publication Data

US 2016/0363273 A1 Dec. 15, 2016

(30) Foreign Application Priority Data

Jun. 11, 2015 (EP) .................................... 15171720

(51) Int. Cl.

| | |
|---|---|
| *F21V 9/16* | (2006.01) |
| *F21V 5/04* | (2006.01) |
| *F21V 8/00* | (2006.01) |
| *G03B 21/20* | (2006.01) |
| *G03B 33/12* | (2006.01) |
| *F21V 7/00* | (2006.01) |
| *G02B 27/30* | (2006.01) |
| *H01S 5/40* | (2006.01) |

(52) U.S. Cl.
CPC .............. *F21V 5/04* (2013.01); *F21V 7/0058* (2013.01); *G02B 6/0031* (2013.01); *G02B 27/30* (2013.01); *G03B 21/204* (2013.01); *G03B 33/12* (2013.01); *H01S 5/4025* (2013.01)

(58) Field of Classification Search
CPC ......... F21V 5/04; F21V 7/0058; G02B 27/30; G02B 6/0031; G03B 21/204; G03B 33/12; H01S 5/4025
USPC .......................................................... 362/84
See application file for complete search history.

(56) References Cited

U.S. PATENT DOCUMENTS

| | | | |
|---|---|---|---|
| 2013/0314672 A1 | 11/2013 | Ogura | |
| 2014/0022512 A1 | 1/2014 | Li et al. | |
| 2015/0167905 A1* | 6/2015 | Khrushchev | F21K 9/56 362/84 |
| 2016/0173837 A1* | 6/2016 | Miyata | G03B 21/2013 353/31 |

FOREIGN PATENT DOCUMENTS

| | | | |
|---|---|---|---|
| JP | 2004327361 A | 11/2004 | |
| JP | 2004341105 A | 12/2004 | |

* cited by examiner

*Primary Examiner* — Seung Lee
(74) *Attorney, Agent, or Firm* — Volpe and Koenig, P.C.

(57) ABSTRACT

A laser source is described. The laser source is configured for providing collimated laser beams arranged in a ring-shape for exiting a phosphor. The laser source has laser diodes arranged in a ring-shaped manner around a symmetry axis. Parallel parts of the laser beams form a hollow tube. Further, a light source is described. The light source has a phosphor, an optical element and a light source configured for providing collimated laser beams arranged in a ring-shape for exiting the phosphor. The light source is arranged such that the collimated laser beams are directed opposite to the collimated luminance.

11 Claims, 2 Drawing Sheets

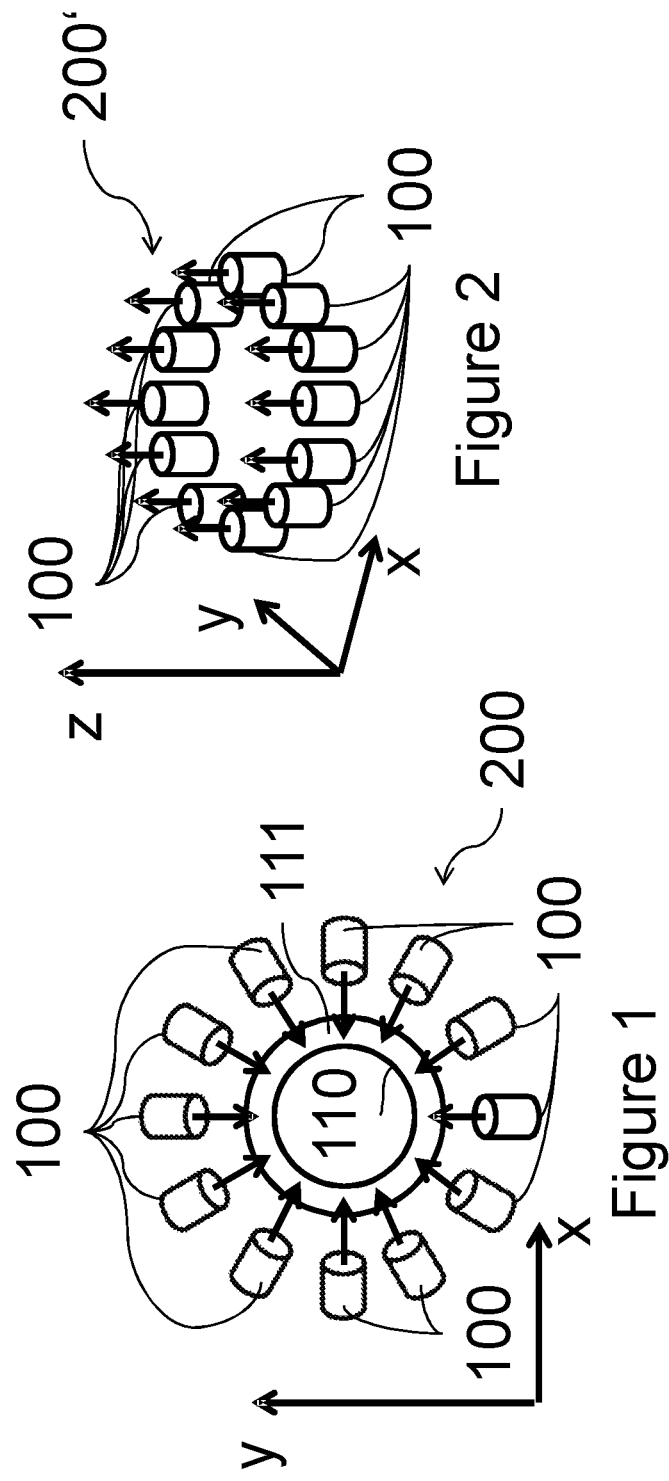

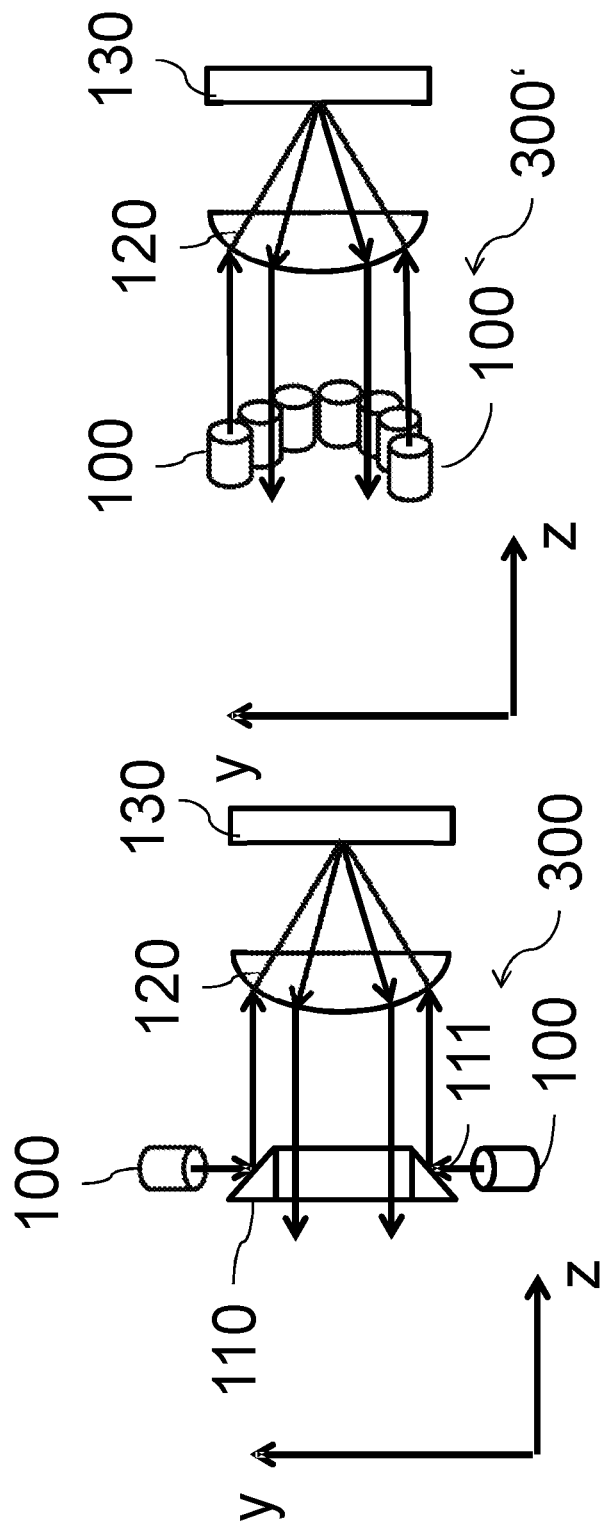

LASER SOURCE FOR EXITING A PHOSPHOR AND LIGHT SOURCE COMPRISING A PHOSPHOR

CROSS REFERENCE TO RELATED APPLICATION

This application claims the benefit of European Patent Application No 15171720.4 filed on Jun. 11, 2015, which is incorporated by reference as if fully set forth.

FIELD OF INVENTION

The field of the invention is excitation of a phosphor.

BACKGROUND

Exited phosphor can be used as a laser source, for instance for laser phosphor displays (LPD). An LPD is a large-format display technology that uses lasers to activate the phosphor that can be used to create the images.

Laser light sources can be used for exiting a phosphor. Some laser light sources comprise arrays of laser diodes emitting collimated laser beams. An optical element focuses the laser beams onto the phosphor. Luminance of the exited phosphor is collected and collimated by a further optical element.

For instance, JP 2004327361 A describes a lighting device which comprises semiconductor light-emitting elements arranged so that emitted light converges into the optical converging point, and a fluorescent body arranged at the optical converging point emitting visible light by converting a wave length of the excited light emitted from the semiconductor light-emitting element. JP 2004341105 A addresses a light emitting diode emitting ultraviolet light which is used for the light source, and a visible light reflection film having characteristic that the ultraviolet light is transmitted and visible light is reflected is formed on the surface of a color wheel on the light source side, and phosphor layers respectively emitting the visible light corresponding to the color light beams.

US 2013/0314672 A1 discloses a light source unit comprising a light source for shining light and a light emitting member for emitting light using light shone from the light source as excitation light, wherein the light emitting member has a diffusion layer in at least a light shining area where light from the light source is shone for diffusion of the light so shone. US 2014/0022512 A1 addresses phosphor-based lamps for a projection display. Output of a plurality of excitation lasers is directed through small apertures of a recycling collar towards phosphor materials.

The laser diodes need cooling and adjustment and the components require some installation space for arrangement.

SUMMARY

In one aspect of the invention, a laser source is provided. The laser source is configured for providing collimated laser beams arranged in a ring-shape for exiting a phosphor.

The laser source may comprise laser diodes arranged in a ring-shaped manner and parallel parts of the laser beams form a hollow tube. An optical element may be comprised configured for at least deflecting the parallel laser beams such that each of the deflected laser beams draw an angle of 20° to 39° with the parallel parts of the laser beams. The angle may be 30°. The laser beams may be collimated laser beams. According to a preferred embodiment, the ring is defined by a closed loop, where the laser beams are arranged along the periphery of the ring. According to a preferred embodiment, the closed loop is formed as a circle.

In one other aspect of the invention, a light source is provided wherein the light source has a phosphor, an optical element and a light source according to the embodiment for exiting the phosphor. The light source is arranged such that the collimated laser beams are directed opposite to the collimated luminance. The optical element may be configured for collimating luminance of the phosphor.

The laser source may have laser diodes. The laser diodes may be arranged in a ring-shaped manner. The laser diodes may be arranged such that each can irradiate a laser beam directed towards a symmetry axis of the ring. The laser source may further have at least one reflecting element arranged with respect to the laser diodes such that the reflecting element reflects the laser beams parallel to the symmetry axis.

The reflecting element may be a hollow circular cone segment arranged symmetrically with respect to the symmetry axis. The laser diodes may face a reflective outer facet of the cone segment.

The reflecting element may also collimate the laser beams.

The facet may be inclined with respect to the symmetry axis by 40-51° which corresponds to between a ninth and a seventh of a full circle of 360° wherein an eighth of the full circle or 45° is preferred. The facet may be inclined with respect to the symmetry axis by 45°.

The optical element may be further configured for at least deflecting the collimated laser beams towards a plane surface of the phosphor such that each of the deflected laser beams impinges on the surface under 51-70° which corresponds to between a seventh and a fifth of a full circle of 360°. The deflected laser beams may light on the surface under 60°.

The optical element may be further configured for focusing each of the deflected laser beams onto a focus point or a focus area of the optical element. The focus area may be an elliptic, particularly circular.

In yet one other aspect of the invention, a light source is provided wherein the light source has a phosphor, an optical element and a light source according to the embodiment for exiting the phosphor. The light source is arranged such that the collimated laser beams are directed opposite to the collimated luminance The characteristics, features and advantages of this invention and the manner in which they are obtained as described above, will become more apparent and be more clearly understood in connection with the following description of exemplary embodiments, which are explained with reference to the accompanied drawings.

BRIEF DESCRIPTION OF THE DRAWINGS

The drawings show, exemplarily and schematically, in
FIG. 1 a first embodiment of the present invention;
FIG. 2 a second embodiment of the present invention;
FIG. 3 a third embodiment of the present invention; and
FIG. 4 a fourth embodiment of the present invention.

DETAILED DESCRIPTION OF THE INVENTION

FIG. 1 shows a first embodiment of the invention. A laser source 200 comprises a plurality of laser diodes 100. The example depicted shows 12 laser diodes 100 but the number is exemplary and may be varied.

Laser diodes 100 are arranged in an x-y-plane in a ring-shape manner. In the first embodiment, the laser diodes 100 are configured for irradiating laser beams in the x-y-plane in a radial fashion towards a center point. The laser diodes 100 are uniformly distributed along the ring's periphery, but the present invention in not limited thereto. Alternatively it is also possible to realize embodiments in which the laser diodes 100 are unevenly distributed along the circle.

A symmetry axis of a reflecting element 110 passes through the centre point. The symmetry axis is parallel to the z-axis perpendicular to the x-y-plane. The reflecting element 110 is a hollow circular cone segment. Its outer facet 111 is reflective and inclined with respect to the z-axis by between 40°-50°, preferably by 45°, wherein 360° corresponds to the full circle.

The laser diodes 100 emit laser beams in the x-y-plane onto the outer facet 111 of the reflecting element 110. The outer facet 111 reflects each of the laser beams by 90°. In one embodiment the reflective element 110 is collimating, too. In one another embodiment the reflective element 110 is reflecting, only, and the laser beams are collimated individually prior to being reflected, e.g. by the laser diodes 100. Then, the reflected laser beams are collimated in parallel with the z-axis.

The ring-shape arrangement allows for a reflective excitation of the phosphor, i.e. the phosphor can be exited from the same side to which it emits. This in turn enables a compact arrangement. It is preferred that the phosphor is excited by a reflective arrangement, but the invention is not limited thereto. Alternatively it would be possible that the phosphor is excited using a transmissive arrangement.

FIG. 2 shows a second embodiment of the invention. A laser source 200' comprises a plurality of laser diodes 100. The example depicted shows 12 laser diodes 100 but the number is exemplary and may be varied.

Laser diodes 100 are arranged in an x-y-plane in a ring-shape manner. The laser diodes 100 are configured for irradiating collimated laser beams in parallel to the z-axis perpendicular to the x-y-plane. Hence the laser beams are collimated and form a hollow tube.

The laser diodes in the arrangement of the first or the second embodiment can be cooled efficiently wherein cooling can be more efficient in the first embodiment because the laser diodes are arranged still more separated from each other. They can be arranged for exiting a phosphor in a manner that luminance originating from the exited phosphor can propagate in an opposite direction opposite to a direction along which the collimated laser beams propagate. Thereby installation space is reduced wherein installation space can be still more reduced in the second embodiment. Yet further the laser diodes may be arranged on a rotatable revolving element. After adjustment of one laser diode rotating the revolving element replace the one laser diode by a next laser diode which then can be adjusted in the same place in which the one laser diode was adjusted before.

FIG. 3 shows how the first embodiment shown in FIG. 1 can be used in a third embodiment for exiting a phosphor 130. FIG. 3 shows a section in the y-z-plane. Since the collimated laser beams form a hollow tube luminance originating from the exited phosphor 130 can propagate in an opposite direction opposite to a direction along which the collimated laser beams propagate.

The collimated laser beams are coupled into an optical element 120. The optical element 120 may be a lens and focuses the laser beams onto a focal point or a focal area on a surface of the phosphor 130. The laser beams light the surface between 50°-60° with respect to the surface, preferably by 60° with respect to the surface, wherein 360° corresponds to the full circle. The area can be elliptic, particularly circular.

The optical element 120 receives luminance from the phosphor and collimates it such that it propagates opposite to the laser beams through the hollow part of the tube formed by the laser beams and through the hollow part of the hollow circular cone segment 110.

FIG. 4 shows how the second embodiment shown in FIG. 2 can be used in a fourth embodiment for exiting a phosphor 130. FIG. 4 shows a section in the y-z-plane. Since the collimated laser beams form a hollow tube luminance originating from the exited phosphor 130 can propagate in an opposite direction opposite to a direction along which the collimated laser beams propagate.

The collimated laser beams are coupled into an optical element 120. The optical element 120 focuses the laser beams onto a point on a surface of the phosphor 130. The laser beams light the surface between 50°-60° with respect to the surface, preferably by 60° with respect to the surface, wherein 360° corresponds to the full circle.

The optical element 120 receives luminance of the phosphor and collimates it such that it propagates opposite to the laser beams through the hollow part of the tube formed by the laser beams.

The collimated luminance may be further adjusted, for instance homogenized. Additionally or alternatively a predetermined light distribution may be achieved through the further adjustment. The collimated luminance, optionally further adjusted, may be used for illuminating a digital micro mirror device (DMD). This in turn may be used in a laser phosphor display or in a laser phosphor projector.

While this invention has been described in connection with what is presently considered to be practical exemplary embodiments, it is to be understood that the invention is not limited to the disclosed embodiments, but, on the contrary, is intended to cover various modifications and equivalent arrangements included within the scope of the appended claims.

What is claimed is:

1. A laser source configured for providing laser beams arranged in a ring-shape manner for exiting a phosphor, the laser source comprising:
   laser diodes arranged in a ring-shaped manner around a symmetry axis, wherein parallel parts of the laser beams form a hollow tube, wherein each laser diode can irradiate a laser beam directed towards the symmetry axis of a ring defined by the laser diodes;
   an optical element configured for at least deflecting the parallel parts of the laser beams, each of the deflected laser beams drawing an angle of 30° with the parallel parts of the laser beams; and
   at least one reflecting element arranged with respect to the laser diodes such that the reflecting element reflects the laser beams parallel to the symmetry axis for forming the hollow tube,
   wherein the reflecting element is a hollow circular cone segment arranged symmetrically with respect to the symmetry axis, the laser diodes facing a reflective outer facet of the cone segment.

2. The laser source of claim 1, wherein the laser diodes are arranged such that the laser diodes irradiate the collimated laser beams.

3. The laser source of claim 1, wherein the reflecting element is further adapted to collimate the laser beams.

4. The laser source of claim 3, wherein the facet is inclined with respect to the symmetry axis by 40° to 51°.

5. The laser source of claim 4, wherein the facet is inclined with respect to the symmetry axis by 45°.

6. A light source comprising:
a phosphor;
an optical element for collimating luminance of the phosphor; and
a laser source for exiting the phosphor, the laser source being configured for providing laser beams arranged in a ring-shape manner for exiting a phosphor, wherein the laser source comprises:
  laser diodes arranged in a ring-shaped manner around a symmetry axis, wherein parallel parts of the laser beams form a hollow tube, wherein the laser diodes are arranged such that each laser diode can irradiate a laser beam directed towards the symmetry axis of a ring defined by the laser diodes;
  an optical element configured for at least deflecting the parallel parts of the laser beams such that each of the deflected laser beams draws an angle of 30° with the parallel parts of the laser beams; and
  at least one reflecting element arranged with respect to the laser diodes such that the reflecting element reflects the laser beams parallel to the symmetry axis for forming the hollow tube, wherein the reflecting element is a hollow circular cone segment arranged symmetrically with respect to the symmetry axis, the laser diodes facing a reflective outer facet of the cone segment,
the laser source being arranged such that the collimated laser beams are at least partly directed through the ring-shaped laser source.

7. The light source of claim 6, wherein the optical element is further configured for at least deflecting the collimated laser beams towards a plane surface of the phosphor such that each of the deflected laser beams impinges on the surface of the phosphor under an angle of 51° to 70°.

8. The light source of claim 7, wherein the deflected laser beams impinge on the surface of the phosphor under an angle of 60°.

9. The light source of claim 6, wherein the optical element is further configured for focusing each of the deflected laser beams onto a focal area of the phosphor.

10. The light source of claim 9, wherein the focal area is elliptic, particularly circular.

11. A laser projector comprising:
a light source including:
  a phosphor;
  an optical element for collimating luminance of the phosphor;
  a laser source configured for providing laser beams arranged in a ring-shape manner for exiting a phosphor, wherein the laser source comprises:
    laser diodes arranged in a ring-shaped manner around a symmetry axis wherein parallel parts of the laser beams form a hollow tube, wherein the laser diodes arranged such that each can irradiate a laser beam directed towards the symmetry axis of a ring defined by the laser diodes;
    an optical element configured for at least deflecting the parallel parts of the laser beams such that each of the deflected laser beams draws an angle of 30° with the parallel parts of the laser beams; and
    at least one reflecting element arranged with respect to the laser diodes such that the reflecting element reflects the laser beams parallel to the symmetry axis for forming the hollow tube, wherein the reflecting element is a hollow circular cone segment arranged symmetrically with respect to the symmetry axis,
    wherein the laser diodes facing a reflective outer facet of the cone segment; and
  the laser source being arranged such that the collimated laser beams are at least partly directed through the ring-shaped light source.

* * * * *